United States Patent [19]
Tarutani et al.

[11] Patent Number: 5,380,704
[45] Date of Patent: * Jan. 10, 1995

[54] SUPERCONDUCTING FIELD EFFECT TRANSISTOR WITH INCREASED CHANNEL LENGTH

[75] Inventors: Yoshinobu Tarutani, Yamanashi; Tokuumi Fukazawa, Tachikawa; Uki Kabasawa, Kokubunji; Kazumasa Takagi, Tokyo; Akira Tsukamoto, Kodaira; Masahiko Hiratani, Akishima; Toshikazu Nishino, Kawasaki, all of Japan

[73] Assignee: Hitachi, Ltd., Tokyo, Japan

[*] Notice: The portion of the term of this patent subsequent to Oct. 5, 2010 has been disclaimed.

[21] Appl. No.: 113,006

[22] Filed: Aug. 30, 1993

Related U.S. Application Data

[63] Continuation-in-part of Ser. No. 790,359, Nov. 12, 1991, abandoned, and a continuation-in-part of Ser. No. 647,234, Jan. 29, 1991, Pat. No. 5,250,506.

[30] Foreign Application Priority Data

| Feb. 2, 1990 | [JP] | Japan | 2-21983 |
| Nov. 26, 1990 | [JP] | Japan | 2-321652 |
| Nov. 26, 1990 | [JP] | Japan | 2-321653 |
| Nov. 26, 1990 | [JP] | Japan | 2-321654 |
| Nov. 26, 1990 | [JP] | Japan | 2-321655 |

[51] Int. Cl.$^6$ ............ H01L 39/22; B05D 5/12; H01B 12/00
[52] U.S. Cl. ............ 505/193; 505/191; 505/220; 505/238; 257/36; 257/39
[58] Field of Search ............ 257/36-39; 505/1, 700, 701, 702, 874, 873, 193, 191, 220, 238

[56] References Cited

U.S. PATENT DOCUMENTS

| 3,500,137 | 3/1990 | Schroen et al. | 357/5 |
| 4,888,629 | 12/1989 | Harada et al. | 357/5 |
| 4,948,779 | 8/1990 | Keur et al. | 357/5 |
| 4,983,573 | 1/1991 | Bolt et al. | 427/62 |
| 5,087,605 | 2/1992 | Hedge et al. | 357/5 |
| 5,126,315 | 6/1992 | Nishino et al. | 505/1 |
| 5,138,401 | 8/1992 | Yamazaki | 357/5 |
| 5,250,506 | 10/1993 | Saitoh et al. | 505/1 |

FOREIGN PATENT DOCUMENTS

| 61-208279 | 9/1986 | Japan | 257/39 |
| 0232380 | 9/1988 | Japan | 357/5 |
| 63-239990 | 10/1988 | Japan | . |
| 0010677 | 1/1989 | Japan | 357/5 |
| 0077185 | 3/1989 | Japan | 357/5 |
| 0239977 | 9/1989 | Japan | 357/5 |
| 01268075 | 10/1989 | Japan | . |
| 0092073 | 4/1990 | Japan | 357/5 |
| 02097073 | 4/1990 | Japan | . |

OTHER PUBLICATIONS

Hasegawa et al, "High $t_c$ Superconductivity of $(La_{1-x}Sr_x)_2CuO_4$-Effect of Substitution of Foreign Ions for Cu and La on Superconductivity", Jap. J. Appl. Phys., vol. 26 No. 4, Apr. 1987, pp. L337-L338.

Appl. Phys. Lett. 55 (19), 6 Nov. 1989, American Institute of Physics, pp. 2032–2034: *Fabrication of heteroepitaxial $YBa_2Cu_3O_{7-x}$-$PrBa_2Cu_3O_{7-x}$-$YBa_2Cu_3O_{7-x}$ Josephson devices grown by laser deposition.*

Physical Review Letters, vol. 54, No. 22, 3 Jun. 1985; The American Physical Society, pp. 2449–2452: *Superconducting Proximity Effect in the Native Inversion Layer on InAs.*

(List continued on next page.)

*Primary Examiner*—Rolf Hille
*Assistant Examiner*—Mahshid Saadat
*Attorney, Agent, or Firm*—Kenyon & Kenyon

[57] ABSTRACT

Disclosed herein is a superconducting field effect transistor (FET) which has at least an active region formed from a film of oxide normal conductor, a plurality of electrodes formed from a film of oxide superconductor, and a means to control the current which flows between the electrodes through the active region. Having a much greater electrode distance than the conventional superconducting device, it can be produced easily by lithography without resorting to special techniques.

24 Claims, 12 Drawing Sheets

OTHER PUBLICATIONS

Appl. Phys. Lett. 51 (3), 20 Jul. 1987, R. H. Koch et al.: *Quantum interference devices made from superconducting oxide thin films*, American Institute of Physics, pp. 200–202.

Extended Abstracts of 9th Symposium on Future Electron Devices, Nov. 14–15, 1990, Japan, pp. 85–90.

Oshima et al., "*Superconducting and Structual Properties of the New Ba Ln Cu O Compound System . . .* ", Jap. J. of Appl. Phys., vol. 26, #5, May 1987 pp. L815–L817.

Bordet et al., "*Crystal Structure of $Y_9Ba_{2-1}Cu_3O_6$, A Compound Related to the High-TC Superconductor $YBa_2CU_3O_7$*", Nature, vol. 327, 25 Jun. 1987, pp. 687–689.

Herman et al., "*Electric Structure of Oxygen—Deficient High—TC Superconductors: $YBa_2CU_3O_x(6 \leq X \leq 8)$*", IBM Research Submitted to Solid State Physics 1987.

Poppe et al., "*Epitaxial Multilayers of $YBa_2CU_3O_7$ and $PrBa_2CU_3O_7$ as a Possible Basic for Superconducting Electron Devices*", Solid State Communications, vol. 71, #7, pp. 569–572, 1989.

"Rare-Earth Doping of High TC Superconducting Perovskites", Mc Kinnon et al, Proceedings of Symp. S., MRS, Apr. 1987, pp. 185–187.

"Formation of $YBa_2Cu_3O_7$ Superconducting Films by Ion Implantation", Nastas et al., Appl. Phys. Lett., vol. 52, #20, 5 May 1988, pp. 1729–1731.

"Monolithic Device Fabrication Using High-TC Superconductor", Yoshida et al., Int'l. Electron Devices Meeting, Dec. 1988, pp. 282-IEDM88–285-IEDM88.

"A-Axis Oriented Epitaxial $YBa_2Cu_3O_{7-x}$–$PrBa_2Cu_3O_{7-y}$ Heterostructures", Inam et al., Appl. Phys. Lett., vol. 57, #23, 3 Dec. 1990, pp. 2484–2486.

Batlogg et al., "*Superconductivity Near 70K in a New Family of Layered Copper Oxides*", Nature vol. 336, 17 Nov. 88.

Poppe et al., "*Epitaxial Multilayers of $YBa_2Cu_3O_7$ and $PrBa_2Cu_3O_7$ as a Possible Basis for Superconducting Electronic Devices*", Solid State Communications, vol. 71, No. 7, pp. 569–572, 1989.

SUPERCONDUCTING FIELD EFFECT TRANSISTOR WITH INCREASED CHANNEL LENGTH

This is a continuation-in-part of application Ser.No. 07/790,359 filed 12 Nov. 1991 now abandoned and Ser. No. 07/647,234 filed 29 Jan. 1991 now U.S. Pat. No. 5,250,506. The entire disclosure of 07/647,234 is hereby incorporated by reference.

BACKGROUND OF THE INVENTION

The present invention relates to generally superconducting (FETS), more particularly, to a superconducting FET provided with electrodes of an oxide superconductor which can be produced easily.

There are superconducting devices known as Josephson Junction devices, superconducting transistors, and superconducting quantum interference devices (SQUID). Despite their outstanding characteristic properties such as extremely high operating speed, low power dissipation, and high sensitivity for magnetic field detection, they have been considered to be impracticable because the conventional superconductors become superconducting only at an extremely low temperature close to the liquid helium temperature. A recent breakthrough in this field is the discovery of oxide superconductors that have their temperature higher than the temperature of liquid nitrogen. Superconducting devices based on an oxide superconductor are being put to practical use.

An example of superconducting devices is a superconducting field effect transistor, which is explained in the following with reference to FIG. 1 (sectional view). FIG. 1 shows two sets of identical devices formed on a single substrate. The principle on which this superconducting field effect transistor operates is as follows: A supercurrent induced by the superconducting proximity effect flows from source electrodes 1a, 1b of superconductor to drain electrodes 2a, 2b of superconductor through a semiconductor part 3. This supercurrent is controlled by the application of a gate voltage to gate electrodes 5a, 5b formed on insulators 4a, 4b. In the case where an oxide superconductor is used, it is theoretically known that the distance in which superconducting electrons diffuse from the superconductor to the semiconductor (normal layer) is extremely short. This has led one to believe that the distance between the source and drain electrodes should be shorter than 0.1 μm in the case of superconducting field effect transistor based on an oxide superconductor. In other words, it is generally theorized that superconducting electronics devices (such as a Josphson junction device and superconductor three-terminal device) formed from an oxide superconductor with a high critical temperature should have a channel length corresponding to the coherence length of the oxide superconductor. For example, in the case of a superconducting device formed from a Y—Ba—Cu oxide, which is a typical oxide superconductor, the channel length (or the distance between the two electrodes) should be 0.3–1.4 nm, which is equal to the coherence length of the oxide superconductor. An example of such a superconducting device is reported in Applied Physics Letters, vol. 51, p. 200, 1987. It is a Josephson junction device of Y—Ba—Cu oxide in which the crystal boundary of the oxide constitutes the junction. In other words, the crystal boundary in the narrow part of the Y—Ba—Cu oxide thin film functions as the Josephson junction. The thin film in a loop has two such junction areas to constitute a dc SQUID.

As mentioned above, it has been considered that the Josephson junction and the channel length of a superconducting three-terminal device should have an extremely small dimension, say 1 nm, which equals the coherence length of the oxide superconductor. Unfortunately, it is impossible to form a pattern of oxide superconductor accurately on the order of a nanometer even with the most advanced fine pattern fabrication technique. In other words, there has been no method for producing superconducting devices by forming various fine patterns with high accuracy as designed. The conventional technology does not permit the production of devices with uniform characteristics as designed and the integration of many identical elements on a single substrate. It is very difficult to produce superconducting devices (such as three-terminal devices) which are more complicated in structure than conventional diodes.

SUMMARY OF THE INVENTION

The present invention is directed to solving the above-mentioned problems involved in the prior art technology. It is an object of the present invention to provide a superconducting device that can be produced easily by the currently available lithographic technology.

It is another object of the present invention to provide a superconducting device which has electrodes of an oxide superconductor, wherein the distance between the electrodes (or the length of channel region) is not excessively short.

According to the present invention, the electrodes are formed from an oxide superconductor and the channel region is formed from an normal oxide conductor and the distance between the electrodes is within a prescribed range.

It has been considered that the distance between the electrodes (or the length of the channel region) should be as short as 0.1 μm or less in the case where the electrodes are formed from an oxide superconductor. Contrary to this general belief, the present inventors found that the oxide superconductor permits supercurrent to flow a longer distance than expected from the known theory owing to the proximity effect. (This was reported in Extended Abstracts of the 9th Symposium on Future Electron Devices, pp. 85–90, 1990.)

The present inventors experimented with a layered film of sandwich structure as shown in FIG. 2, which is composed of one middle layer 12 of $La_{1.5}Ba_{1.5}Cu_3O_y$ normal conductor (800 nm thick) and two outer layers 11 and 13 of $YBa_2Cu_3O_y$ superconductor, to test its electrical properties at the liquid helium temperature. Theoretically (as mentioned above), it is hardly possible that a supercurrent flows across the outer layers 11 and 13 of the superconductor in the case where the middle layer 12 of the normal conductor is as thick as 800 nm. Nevertheless, a supercurrent flowing across the outer layers 11 and 13 of superconductor was detected. This is a new phenomenon which has never been observed. A similar phenomenon was also found when the middle layer of $La_{1.5}Ba_{1.5}Cu_3O_y$ normal conductor was replaced by a 100-nm thick layer of $PrBa_2Cu_3O_y$ normal conductor. It was found that supercurrent flows through the channel layer thicker than 100 mm only in the case where the channel layer is a normal conductor derived from an oxide superconductor, which has substituent cations, nonstoichiometric composition for cations, or oxygen deficiency or oxygen excess. If this specific normal conductor is replaced by other materials such as $SiO_2$, $CaF_2$, $Y_2O_3$, $Al_2O_3$, and ZnO, the phenomenon as mentioned above is not observed.

According to the present invention, the two electrodes of oxide superconductor are arranged a certain distance apart from each other which is longer than the decay length of the probability amplitude of superconducting electron pairs which is determined by the clean limit, and shorter than 10 times the decay length. (The electrodes are connected by a Cu-based oxide normal conductor which forms the active region.) The length determined by the clean limit equals the decay length ($\zeta$) of the probability amplitude of superconducting electron pairs in the normal conductor layer. The distance between the two electrodes should be equal to or longer than the decay length ($\zeta$), as mentioned above. The decay length ($\zeta$) in the clean limit is given by $hv/4\pi^2 kT$ (where h is Planck's constant, k is Boltzmann's constant, v is the Fermi velocity of the carrier, which is given by $$\frac{h'}{n}(3\pi^2 n)^{\frac{1}{3}}$$

(where m is the mass of the carrier, $h'=h/2\pi$, and n is the density of free carriers), and T is the operating temperature.) The value calculated for La—Ba—Cu oxide (an oxide normal conductor) is 50 nm at 10K. This value varies depending on the temperature at which a particular device is operated.

A preferred oxide normal conductor is one which has the same crystal structure (e.g., perovskite structure) as an oxide superconductor and the antiferromagnetic properties or semiconductive properties. It includes oxygen-deficient Y—Ba—Cu oxide, Pr—Ba—Cu oxide, and La—Ba—Cu oxide, and doped Y—Ba—Cu oxide containing metallic elements or ferromagnetic elements (such as Fe, Co, Al, and Ga). The length of the normal layer of these oxides (or the distance between the electrodes of the superconductor) should be greater than the decay length (which is determined individually by the Fermi velocity).

The oxide normal conductor that can be used in the present invention include the following. Oxygen-deficient Y—Ba—Cu oxides having the ionic ratio of Y:Ba:Cu:O=1:2:3:X [X=6.2–6.6], with an allowable variation of ±20% for Y:Ba:Cu. Oxygen-deficient Pr—Ba—Cu oxides having the ionic ratio of Pr:Ba:Cu:O=Y:(3-Y):3:(6.5-7.3) [Y=1–1.5], with an allowable variation of ±20% for Pr:Ba:Cu. Oxygen-deficient La—Ba—Cu oxides having the ionic ratio of La:Ba:Cu:O=Z:(3-Z): 3:(6.5-7.3) [Z=1.3–1.6], with an allowable variation of ±20% for La:Ba:Cu. 3–50% of Cu in the Y—Ba—Cu oxides may be replaced by Fe, Co, Al, or Ga.

The oxide superconductor that can be used in the present invention includes Y—Ba—Cu oxides, La—Sr—Cu oxides, Bi—Sr—Ca—Cu oxides, and Tl—Ba—Ca—Cu oxides. The Y—Ba—Cu oxides may have Y substituted by any of Eu, Gd, Dy, Er, Ho, and Sm. The Y—Ba—Cu oxides may have the ionic ratio of Y:Ba:Cu:O=1:2:3:(6.6-7.0). The La—Sr—Cu oxides may have the ionic ratio of La:Sr:Cu:O=(2-X):X:1:(3.8-4.3) [X=0.05-0.3]. The Bi—Sr—Ca—Cu oxides may have the ionic ratio of Bi:Sr:Ca:Cu:O=2:2:1:2:8 or 2:2:2:3:10. The Ta—Ba—Ca—Cu oxides may have the ionic ratio of Ta:Ba:Ca:Cu:O=2:2:1:2:8 or 2:2:2:3:10. The ratios may vary within ±20%.

The superconducting device of the present invention is a three-terminal device whose basic part is composed of one middle layer of the above-mentioned oxide normal conductor and two outer layers of the above-mentioned oxide superconductor, which are joined on top of the other. This basic part is provided with a gate electrode to control, by voltage application, the supercurrent flowing through the layer of oxide normal conductor. This gate electrode is formed on the layer of the oxide normal conductor with an insulating film interposed between them.

At the interface between the superconducting layer and the normal conducting layer, the density of superconducting carriers is not continuously distributed on account of the discontinuity of atom arrangement and constituent elements. In general, the density of superconducting electrons at the interface discontinuously decreases up to the normal conducting layer.

The rate of decrease depends on the combination of the superconductor and normal conductor. The rate of decrease is great when the two materials are of different species, as in the combination of an oxide superconductor and a metal normal conductor. In order that the density of superconducting electrons does not discontinuously decrease in the interface, it is desirable that the superconductor be combined with a normal conductor of the same crystal structure as the superconductor. It was found that a combination of a Cu-based oxide superconductor and a Cu-based oxide normal conductor is effective in reducing the decrease of the density of superconducting electrons.

A preferred Cu-based oxide normal conductor is one which is given the antiferromagnetic properties or semiconductive properties by the reduction of carriers in a Cu-based oxide superconductor. In general, a metal superconductor does not possess magnetism and superconductivity simultaneously, and it loses its superconductivity when it contains magnetic impurities.

On the other hand, in the case of oxide superconductor it is $CuO_2$ planes which are responsible for superconduction. Although $CuO_2$ is inherently an antiferromagnetic material, its antiferromagnetism is weak in a Cu-based oxide superconductor because carriers (or holes) occur when Cu has a valence Treater than 2 and they cause the electronic wave functions to be less localized. This suggests that the superconductivity of an oxide superconductor depends not on the magnetic properties but on the presence of carriers.

Very little is known about the microscopic mechanism of superconductivity in an oxide superconductor. Phenomenologically, it is assumed that $CuO_2$ planes have something that causes carriers to attract to each other resulting in superconductivity. This is the reason why an oxide superconductor permits the coexistence of superconductivity and antiferromagnetism. It is concluded from the foregoing that the distance superconducting electron pairs travel from the oxide superconducting electrode to the oxide normal conducting layer is greater than the coherence length which is determined by the measurement of critical magnetic field.

In the case of an oxide normal conductor (such as La—Ba—Cu oxide), the decay length to be determined by the dirty limit is about 1 nm according to calculations from the hall coefficient and resistivity. This decay length is apparently associated with the short mean free path of an oxide material. Resistance of an oxide material results not from the scattering due to lattice vibration but from the fact that there is no complete overlapping of wave functions for adjacent atoms.

As mentioned above, a Cu-based oxide potentially possesses the superconducting properties although it is a normal conducting material. The superconducting electron pairs which travel from the superconducting layer to the normal conducting layer retain the superconducting properties even after apparent scattering. This leads one to conclude that the distance superconducting electron pairs travel is not the decay length which is determined by the dirty limit but it rather depends on the clean limit. The distance between the superconducting electrodes exponentially decreases with a constant determined by the clean limit (or the above-mentioned decay length $\zeta$). Therefore, the electrode distance suitable for the Josephson coupling should be in the range from the decay length ($\zeta$) to ten times the decay length ($\zeta$). If the electrode distance is smaller than the decay length ($\zeta$), the phase shift of superconducting wave functions does not take place between electrodes. If the electrode distance is greater than ten times the decay length, the supercurrent density of the device is smaller than $10^5 A/m^2$ which is necessary for practical use.

DETAILED DESCRIPTION OF THE INVENTION

EXAMPLE 1

Figure 3:
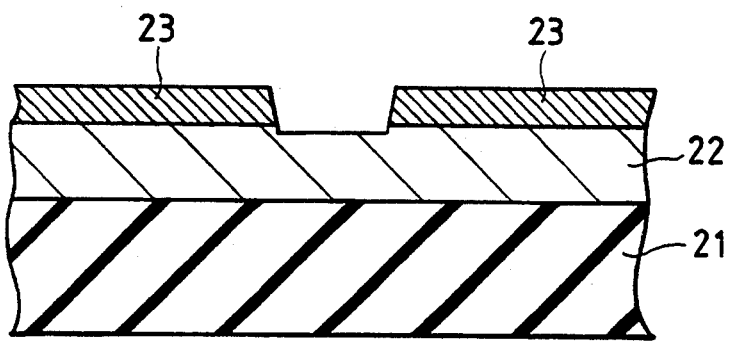
FIG. 3 is a sectional view illustrating the first embodiment of the present invention.
Figure 4:
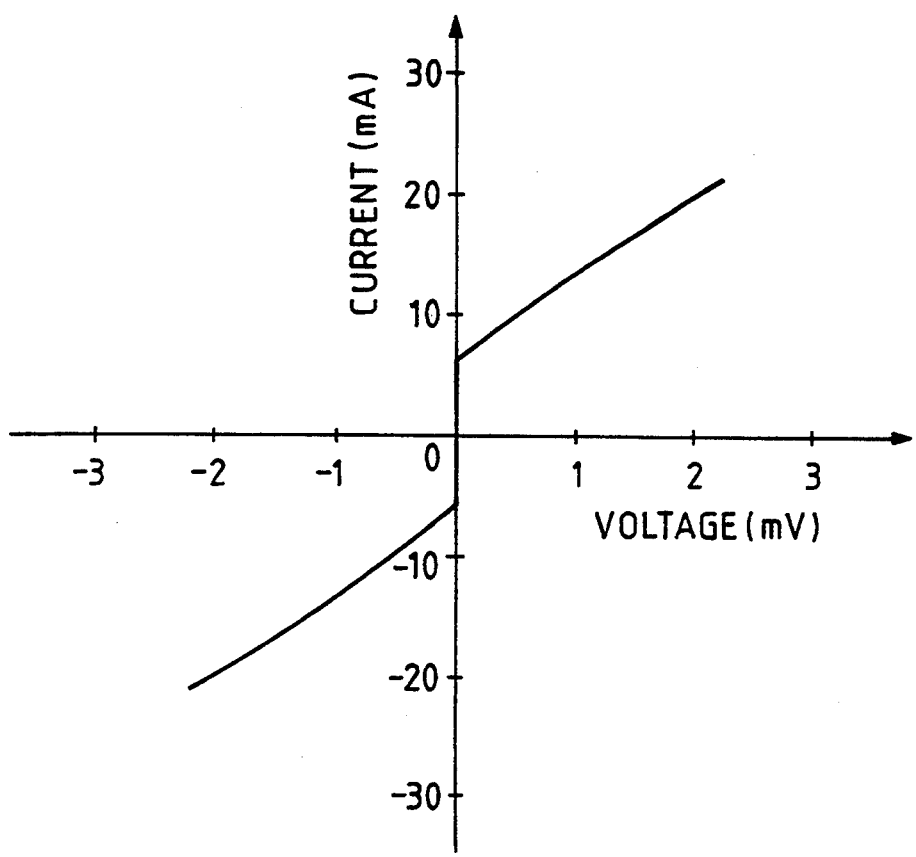
FIG. 4 is graph showing the voltage-current characteristics in the first embodiment of the present invention.

A device of planar structure was prepared by forming on a $SrTiO_3$ substrate a normal conducting layer 22 of La—Ba—Cu oxide (La:Ba:Cu:O=1.5:1.5:3:(6.8–7.1)) and electrodes 23 of Y—Ba—Cu oxide (Y:Ba:Cu:O=1:2:3:(6.8–7.0)), as shown in FIG. 3. The device was tested for voltage-current characteristics, with the distance between the electrodes 23 varied from 0.1 $\mu$m to 0.8 $\mu$m. The device wish an electrode distance of 0.2 $\mu$m gave the voltage-current characteristics as shown in FIG. 4, which indicates the occurrence of superconductivity. The superconductivity was detected at temperatures up to about 70K. The same phenomenon as mentioned above was also observed with other devices with an electrode distance other than 0.2 $\mu$m.

The electrode distance (0.1–0.8 $\mu$m) in this example is 100–1000 times the coherence length (about 1 nm) of an oxide superconductor. This suggests the possibility of reducing the electrode distance much more than believed before by using an oxide normal conductor having the same crystal structure as an oxide superconductor and also having the antiferromagnetic properties and semiconductive properties.

EXAMPLE 2

Figure 5:
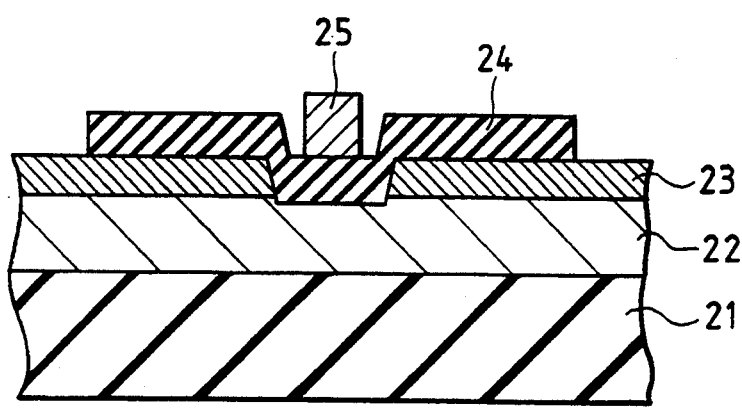
FIG. 5 is a sectional view illustrating the second embodiment of the present invention.
Figure 6:
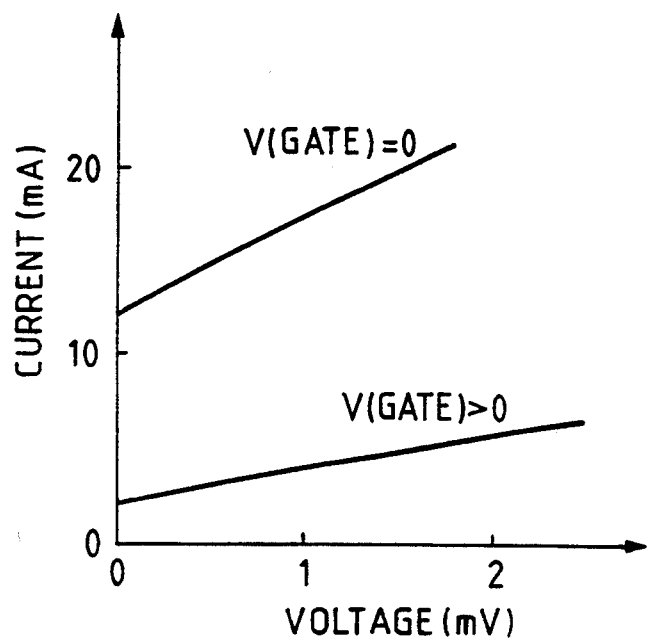
FIG. 6 is a graph showing the voltage-current characteristics in the second embodiment of the present invention.

A superconducting three-terminal device was formed on a substrate 21 of $SrTiO_3$ single crystal with (110) index, as shown in FIG. 5. On this substrate 21 was formed a normal conducting layer 22 of La—Ba—Cu oxide by RF magnetron sputtering under the following conditions. Atmosphere gas: argon-oxygen mixture (50:50%).

Total pressure: 0.4 Pa.
Target: Sintered disc of La—Ba—Cu oxide.
Power source: 13.56 MHz high frequency.
Electric power: 100 W
Substrate temperature: 550°–700° C.

The thus formed La—Ba—Cu oxide layer has the electric resistance similar to that of a semiconductor.

Subsequently, on the La—Ba—Cu oxide layer 22 was formed a superconducting electrode layer 23 (80 nm thick) of Y—Ba—Cu oxide by the reactive vapor deposition method which consists of vaporizing Y, Ba, and Cu in an oxygen atmosphere. The Y—Ba—Cu oxide superconducting layer 23 has its critical temperature at 80K.

The surface of the layer 23 was entirely coated with an organic resist (not shown) and a groove pattern (0.2 μm wide) was formed in the resist by a known electron beam lithography method. Using this resist pattern as the mask, a groove was formed in the Y—Ba—Cu oxide layer 23 by reactive ion beam etching in an atmosphere of argon or argon-oxygen mixture.

This groove divides the Y—Ba—Cu oxide layer into two superconducting electrodes 23 0.2 μm apart.

Then, a $SrTiO_3$ layer (or a gate insulating layer 24) was formed by RF magnetron sputtering in an atmosphere of 50:50 argon-oxygen mixture.

Further, a gate electrode 25 of Au layer was formed on the groove held between the superconducting electrodes 23.

The thus formed three-terminal device of oxide superconductor permits supercurrent to flow between the superconducting electrodes 23. The supercurrent can be controlled by the application of a voltage to the Au gate electrode 25. In other words, when a positive voltage is applied to the gate electrode 25, the carrier concentration in the normal conducting layer 22 decreases. As a result, the effective decay length becomes short and the supercurrent decreases accordingly. In this way the device in this example functions as a superconducting three-terminal device.

The device was tested for its characteristics with the electrode distance varied from 0.1 μm to 1.0 μm. The results indicate that the supercurrent can be controlled by the gate voltage as in the above-mentioned case where the electrode distance is 0.2 μm. In the case of long electrode distance, the supercurrent is low when the gate voltage is zero. In such a case, a negative gate voltage is applied to form the accumulation layer in the normal conducting layer, thereby increasing the carrier density and supercurrent.

In the same manner as mentioned above, another superconducting three-terminal device was prepared in which the superconducting electrode is Y—Ba—Cu oxide, the oxide normal conducting layer is Pr—Ba—Cu oxide (Pr:Ba:Cu:O=1:2:3:(6.8–7.1)), the gate insulation layer is $SrTiO_3$, and the gate electrode is Au. This device, too, permits supercurrent to flow between the Y—Ba—Cu electrodes, which can be controlled by the application of a voltage to the Au gate electrode. Thus, this device functions satisfactorily as the three-terminal device.

Superconducting three-terminal devices of the same structure as mentioned above were prepared in which La—Ba—Cu oxide or Pr—Ba—Cu oxide was replaced by La—Cu oxide or Bi—Sr—Cu oxide (of perovskite structure), oxygen-deficient Y—Ba—Cu oxide, or Y—Ba—Cu oxide containing as impurities ferromagnetic elements and metallic elements (such as Fe, Co, Al, and Ga).

The oxide for the oxide normal conducting layer include the following.

Oxygen-deficient Y—Ba—Cu oxides having the ionic ratio of Y:Ba:Cu:O=1:2:3:X [X=6.2–6.6], with an allowable variation of ±20% for Y:Ba:Cu.

Oxygen-deficient Pr—Ba—Cu oxides having the ionic ratio of Pr:Ba:Cu:O=Y:(2-Y):3:(6.5–7.3) [Y=1–1.5], with an allowable variation of ±20% for Pr:Ba:Cu.

Oxygen-deficient La—Ba—Cu oxides having the ionic ratio of La:Ba:Cu:O=Z:(2-Z):3:(6.5–7.3) [Z=1.3–1.6], with an allowable variation of ±20% for La:Ba:Cu. 3–50% of Cu in the Y—Ba—Cu oxides may be replaced by Fe, Co, Al, or Ga.

The Y—Ba—Cu oxide for the superconducting electrode may be replaced by a Bi—Sr—Ca—Cu oxide or Tl—Ba—Ca—Cu oxide having the perovskite structure.

Other oxides that can be used for the superconducting electrode include the following.

Analogues of Y—Ba—Cu oxides in which Y is replaced by Eu, Gd, Dy, Er, Ho, or Sm.

Y—Ba—Cu oxides having the ionic ratio of Y:Ba:Cu:O=1:2:3:(6.6–7.0), with an allowable variation of ±20%.

La—Sr—Cu oxides having the ionic ratio of La:Sr:Cu:O=(2-X):X:1:(3.8–4.2) [X=0.05–0.3], with an allowable variation of ±20%.

Bi—Sr—Ca—Cu oxides having the ionic ratio of Bi:Sr:Ca:Cu:O=2:2:1:2:8 or 2:2:2:3:10, with an allowable variation of ±20%.

Ta:Ba:Ca:Cu oxides having the ionic ratio of Ta:Ba:Ca:Cu:O=2:2:1:2:8 or 2:2:2:3:10, with an allowable variation of ±20%.

EXAMPLE 3

Figure 7:
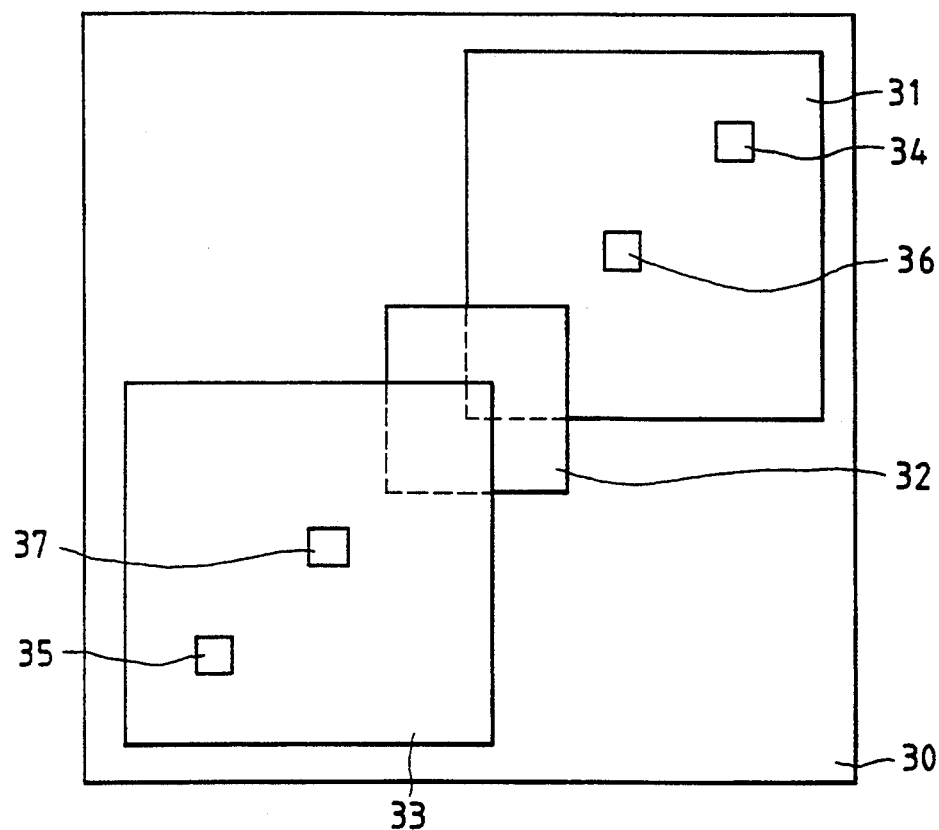
FIG. 7 is a schematic representation showing the relative positions of the superconducting film and normal conducting film in the third embodiment of the present invention.

A laminate structure as shown in FIG. 7 (plane view) was prepared which has the channel layer formed from $La_2CuO_4$ which is a normal conducting compound. All the layers were formed by RF magnetron sputtering under the following conditions.

Substrate temperature: 550° C.
Supplied power: 100 W.
Atmosphere gas: argon-oxygen mixture (50:50%).
Total pressure: 6.65 Pa.

First, on a substrate 30 of $SrTiO_3$ single crystal with (110) index was formed a thin film (10 mm square) 31 of $La_{2-x}Sr_xCuO_4$ (x=0.15) , with a stainless steel mask placed on the substrate. Then a thin film (5 mm square) 32 of $La_{2-x}Sr_xCuO_4$ (x=0) (containing no Sr) was formed through a metal mask, with a part (3 mm square) thereof overlapping with the previously formed thin film 31, as shown in FIG. 7. Further, a thin film (10 mm square) 33 was formed from $La_{2-x}Sr_xCuO_4$ (x=0.15), which is the same material as used for the lower thin film 31, with a part (3 mm square) thereof overlapping with the channel layer 31. The thus formed three layers have an overlapped part (1 mm square). The lower layer 31 is 700 nm thick, the channel layer 32 is 800 nm thick, and the upper layer 33 is 400 nm thick. Finally, the laminate underwent heat treatment in argon at 400° C. for 12 hours.

After the heat treatment, the single layer of $La_{2-x}Sr_xCuO_4$ (x=0.15) exhibited superconductivity at a critical temperature of 32K. On the other hand, the single layer of $La_{2-x}Sr_xCuO_4$ (x=0) showed no sign of superconduction in the current-voltage characteristics and produced no Meissner effect when measured with a SQUID magnetometer at 4.2K. Apparently it remained to be a complete non-superconductor.

Figure 8:
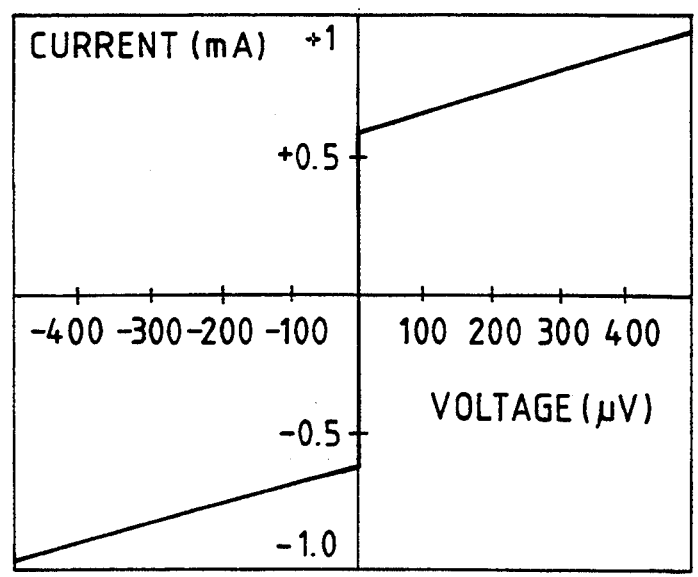
FIG. 8 is a graph showing the voltage-current characteristics in the third embodiment of the present invention.

The laminate structure prepared as mentioned above was tested for current-voltage characteristics at 4.2K according to the four-terminal probe method. The results are shown in FIG. 8. The test was carried out by measuring the voltage between the two terminals 36, and 37 which is induced when an electric current is applied to the terminals 34 and 35. The terminals are gold wires (50 μm in diameter) electrically contacted with the sample with indium. The non-linearity of current in the neighborhood of zero voltage shown in FIG.

8 suggests that supercurrent flows between the two superconducting layers 31 and 33 through the normal conducting layer 32 (800 nm thick), with the direction of the supercurrent being perpendicular to the surface of the normal conducting layer 32.

EXAMPLE 4

The same procedure as in Example 3 was repeated except that the channel layer (normal conducting layer) was formed from $La_{2-x}Sr_{Cu}O_4$ (x=0.4) (which contains more Sr than $La_{2-x}Sr_xCuO_4$ (x=0.15) for the superconducting layer) in place of $La_{2-x}Sr_xCuO_4$ (x=0) which contains no Sr. The channel layer is 800 nm thick. It was found that the channel layer remained non-superconducting electrically and magnetically at 4.2K. The laminate structure was tested for current-voltage characteristics by the four-terminal probed method. The results indicate the non-linearity of current in the neighborhood of zero voltage, as in the case of Example 3.

EXAMPLE 5

Figure 9:
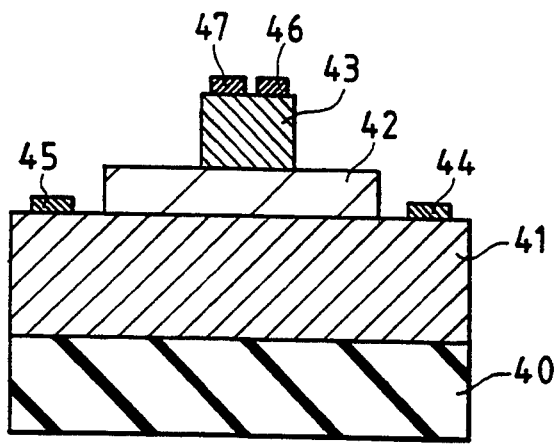
FIG. 9 is a sectional view illustrating the fifth embodiment of the present invention.

A laminate structure as shown in FIG. 9 was prepared which has the channel layer formed from $PrBa_2Cu_3O_y$ which is a normal conducting compound. All the thin films were formed by RF magnetron sputtering under almost the same conditions as in Example 3. First, on a substrate 40 (10 mm square) of $SrTiO_3$ single crystal with (110) index was formed a layer 41 of $YBa_2Cu_3O_y$. On the center of this layer was formed a layer 42 of $PrBa_2Cu_3O_y$, with a metal mask (6 mm square) placed thereon, as shown in FIG. 9. Then on the center of the layer 42 was formed a layer 43 of $YBa_2Cu_3O_y$ (which is same material as used for the lower layer 41), with a metal mask (2 mm square) placed thereon. The lower layer 41 is 700 nm thick, the channel layer 42 is 100 nm thick, and the upper layer 43 is 400 nm thick. Finally, the laminate underwent heat treatment in argon at oxygen plasma at 450° C. for 30 minutes.

After the heat treatment, the single layer of $YBa_2Cu_3O_y$ exhibited superconductivity at a critical temperature of 62K. On the other hand, the single layer of $PrBa_2Cu_3O_y$ showed no sign of superconductivity in the current-voltage characteristics and produced no Meissner effect when measured with a SQUID fluxmeter at 4.2K. Apparently it remained to be a complete non-superconductor.

Figure 10:
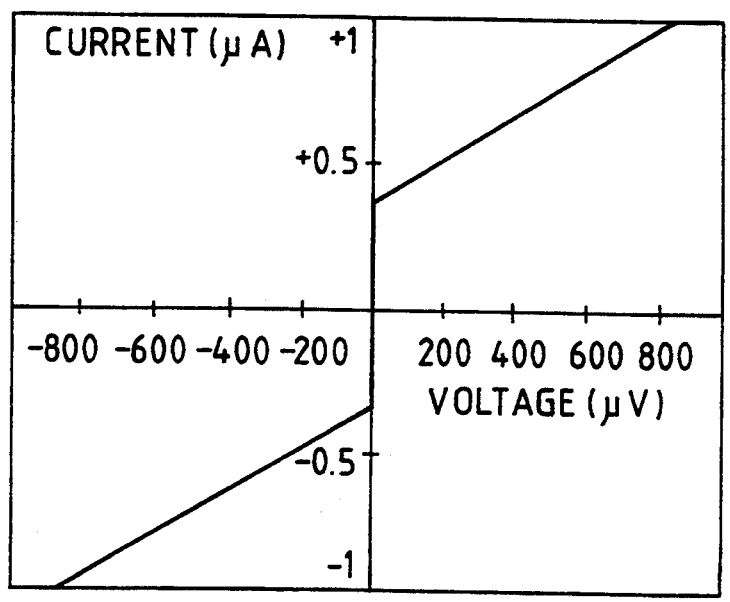
FIG. 10 is a graph showing the voltage-current characteristic in the fifth embodiment of the present invention.

The laminate structure prepared as mentioned above was tested for current-voltage characteristics at 4.2K according to the four-terminal probe method. The results are shown in FIG. 10. The test was carried out by measuring the voltage between the two terminals 46 and 47 which is induced when an electric current is applied to the terminals 44 and 45. The terminals are gold wires (50 μm in diameter) electrically contacted with the sample with indium. The non-linearity of current in the neighborhood of zero voltage shown in FIG. 10 suggests that supercurrent flows between the two superconducting layers 41 and 43 through the normal conducting layer 42 (100 nm thick).

EXAMPLE 6

Figure 11:
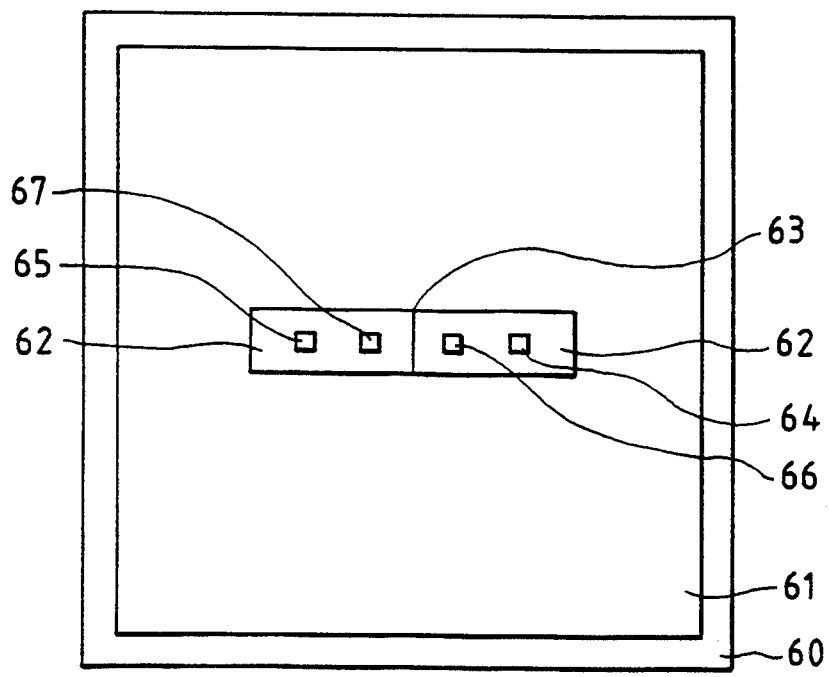
FIG. 11 is a schematic representation illustrating sixth embodiment of the present invention.

A laminate structure as shown in FIG. 11 (plan view) was prepared which has the channel layer formed from $La_{1.5}Ba_{1.5}Cu_3O_y$ which is a normal conducting compound. First, on a substrate 50 of $SrTiO_3$ single crystal with (110) index was formed a thin film 51 (300 nm thick) of $La_{1.5}Ba_{1.5}Cu_3O_y$ by RF magnetron sputtering under almost the same conditions as in Example 3. On the center of this film was formed a thin film (1×5 mm) 52 of $HoBa_2Cu_3O_y$ by the reactive vapor deposition method that employs ECR oxygen plasma, with a metal mask placed thereon, as shown in FIG. 11. The vapor deposition was carried out under the following conditions.

Microwave: 2.45 GHz generated by a 120 W magnetron.
Magnetic field: 875 G.
Atmosphere: Oxygen at $10^{-4}$ Torr.
Rate of deposition: 0.6 nm/sec.
Substrate temperature: 560° C.
Film thickness: 80 nm.

After resist coating, a linear pattern (200 nm wide) crossing the thin film 52 was formed by electron beam lithography. Using this resist pattern as the mask, a groove channel 53 was formed by reactive ion beam etching. The groove is 25 nm deep. Finally, the laminate underwent heat treatment in ECR oxygen plasma at 450° C. for 30 minutes.

After the heat treatment, the single layer of $HoBa_2Cu_3O_y$ exhibited superconduction at a critical temperature of 78K. On the other hand, the single layer of $La_{1.5}Ba_{1.5}Cu_3O_y$ showed no sign of superconductivity in the current-voltage characteristics and produced no Meissner effect when measured with a SQUID magnetometer at 4.2K. Apparently it remained to be a complete non-superconductor.

Figure 12:
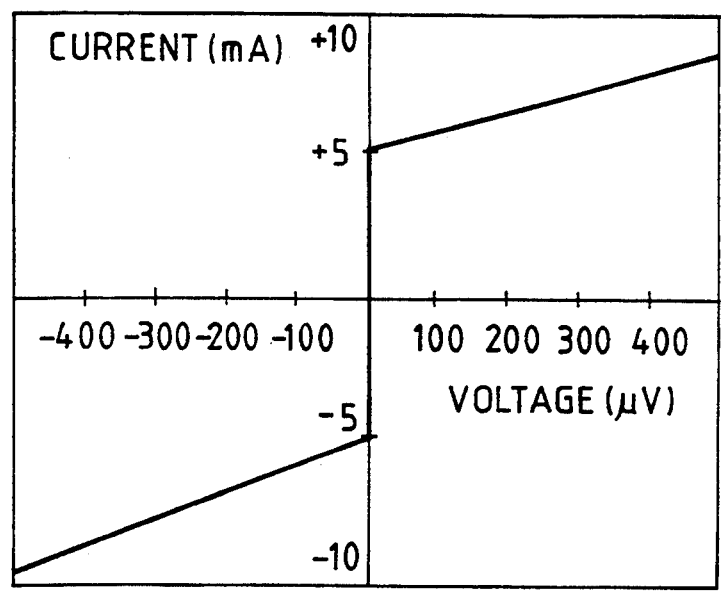
FIG. 12 is a graph showing the voltage-current characteristics the sixth embodiment of the present invention.
Figure 13:
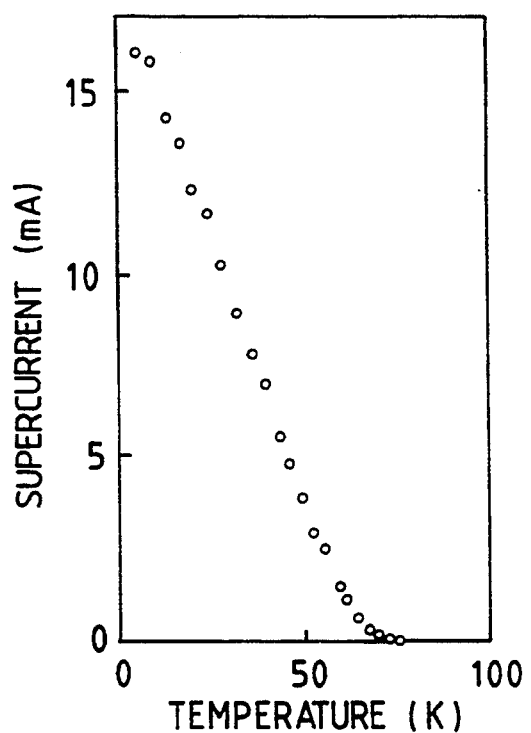
FIG. 13 is a graph showing the dependence of supercurrent on temperature in the sixth embodiment of the present invention.
Figure 14:
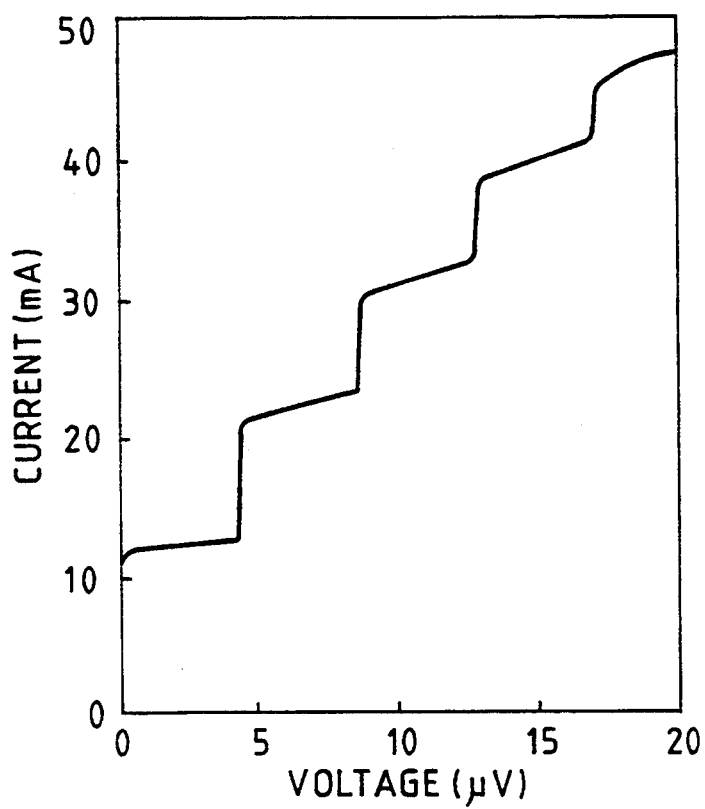
FIG. 14 is a graph showing the Shapiro step in the sixth embodiment of the present invention.

The laminate structure prepared as mentioned above was tested for current-voltage characteristics at 4.2K according to the four-terminal probe method. The results are shown in FIG. 12. The Zest was carried out by measuring the voltage between the two terminals 56 and 57 which is induced when an electric current is applied to the terminals 54 and 55. The terminals are gold wires (50 μm in diameter) electrically contacted with the sample with indium. The non-linearity of current is observed in the neighborhood of zero voltage. The temperature dependence of supercurrent is shown in FIG. 13. Supercurrent was detected at temperatures up to 76K, which is close to the critical temperature of the superconducting layer 52 of $HoBa_2Cu_3O_y$. FIG. 14 shows the Shapiro step observed at 4.2K and 2 GHz. The above-mentioned electrical properties indicate that supercurrent flows across the superconductor 52 through the 200 nm wide groove channel 53.

The devices in Examples 7 to 12 that follow are so designed as to control the supercurrent flowing between the source electrode and drain electrode by input signals applied to a plurality of gate electrodes formed on the channel.

Figure 15:
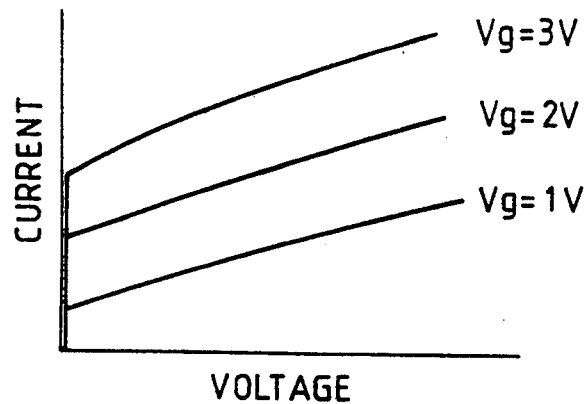
FIG. 15 is a graph showing the gate voltage dependence of the voltage-current characteristics in the three-terminal device.

The current flowing between the source and drain electrodes varies depending on voltage applied to the gate electrode, as shown in FIG. 15. Therefore, if different voltages are applied to a plurality of gate electrodes formed on the channel, the output voltage to loads takes on a plurality of values. In addition, a multi-output circuit can be constructed by arranging the source electrodes, drain electrodes, and gate electrodes on a plane surface. Forming a plurality of gate electrodes on the channel is possible because the supercurrent flows over a long distance.

EXAMPLE 7

Figure 16A:
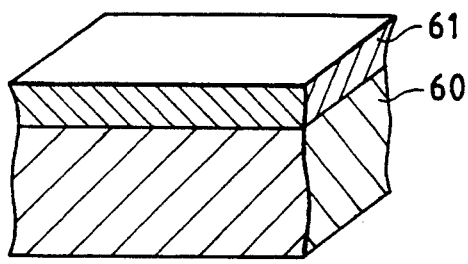
FIGS. 16a to 16d are schematic representations showing the manufacturing process in the seventh embodiment of the present invention.
Figure 16B:
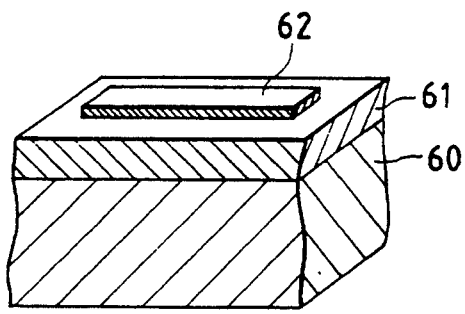
Figure 16C:
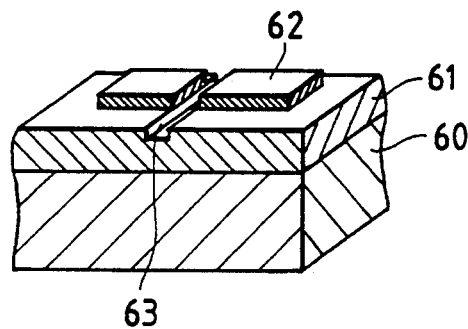
Figure 16D:
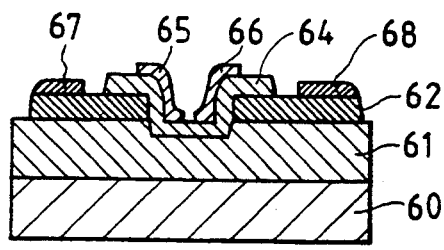

A three-terminal superconducting device was prepared by the process illustrated in FIGS. 16a to 16d. First, on a stress-free mirror-finished substrate 60 of $SrTiO_3$ single crystal with (110) index was formed a thin film 61 (0.2 μm thick) of $La_{1.5}Ba_{1.5}Cu_3O_y$ by magnetron sputtering, with the substrate temperature kept at 700° C. for epitaxial growth. On this film was formed a narrow rectangular film (0.1 mm wide, 5 mm long, and 0.08 μm thick) 62 of $YBa_2Cu_3O_x$ by reactive vapor deposition, wish a metal mask place thereon, as shown in FIG. 16b. After resist coating, a linear pattern (0.2 μm wide) was formed at the center of the narrow rectangular film 62 in the direction parallel to the short side, by electron beam lithography. Using this resist pattern as a mask, the film 62 underwent reactive ion beam etching, to form a groove channel 63 as shown in FIG. 16c. On this groove channel 63 was formed a 0.1 μm thick gate insulating film 64 of $SrTiO_3$ by sputtering. After gold vapor deposition, unnecessary parts of the gold film were removed by electron beam lithography and etching to form two gate electrodes 65 and 66, a source electrode 67 and a drain electrode 68 on the gate insulating film 64 and the superconducting film 62.

Figure 17:
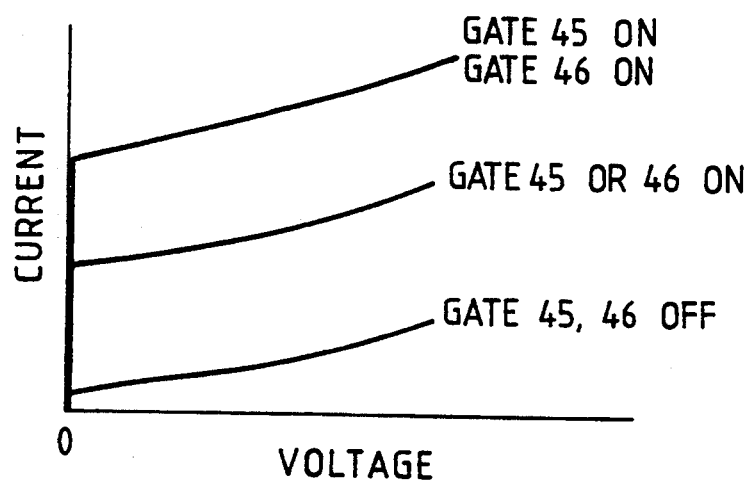
FIG. 17 a graph showing the voltage-current characteristics in the seventh embodiment of the present invention.

The dependence of source-drain current on the gate voltage was measured at 4.2K (liquid helium temperature) and 50K. The results are shown in FIG. 17. It is noted that supercurrent flows between the source electrode 67 and drain electrode 68 as voltages are applied to the gate electrodes 65 and 66, and that the magnitude of the super-current can be controlled by varying the voltages applied to the gate electrodes 65 and 66. This device is capable of OR operation and AND operation at a properly established threshold value.

EXAMPLE 8

A device of the same structure as in Example 7 was prepared, except that the electron beam patterning was performed under different conditions so that the channel is 0.3 μm wide and three electron gates were formed. The dependence of source-drain current on the gate voltage was measured at the liquid helium temperature. Because of the extended channel length, the supercurrent greatly decreased. Nevertheless, the magnitude of supercurrent varied depending on the voltage applied to the individual gates. Thus it was possible to control the output voltage to loads.

EXAMPLE 9

A device of the same structure as in Example 7 was prepared except that the oxide semiconductor layer was formed from $Nd_{1.3}Ba_{1.7}Cu_3O_z$ or $PrBa_2Cu_3O_w$ and the superconductor layer was formed from $HoBa_2Cu_3O_m$. The dependence of source-drain current on the gate voltage was measured. The results were the same as those in Example 7.

Example 10

A device of the same structure as in Example 7 was prepared except that the channel is 0.3 μm long and the first gate electrode is 0.08 μm wide and the second gate electrode is 0.16 μm wide (so that the control signals applied to the gates vary). The dependence of source-drain current on the gate voltage was measured. The results were almost the same as those in Example 7.

EXAMPLE 11

Figure 18A:
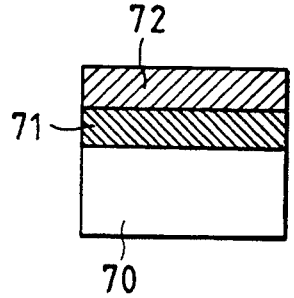
FIGS. 18a and 18b schematic representations illustrating the eleventh embodiment of the present invention.
Figure 18B:
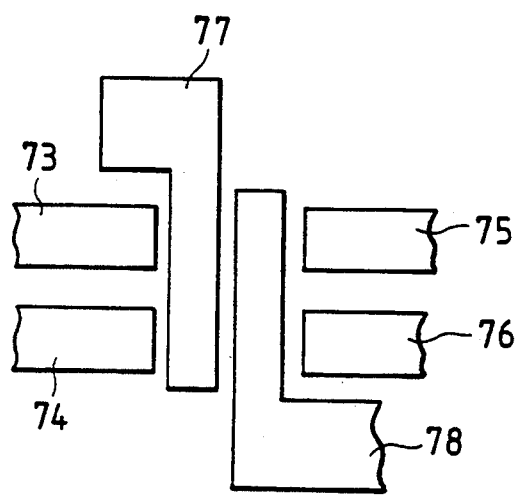

A device as shown in FIG. 18a was prepared in the same manner as in Example 7. On a substrate 70 was formed an oxide semiconductor layer 71, and then a film 72 of $YBa_2Cu_3O_x$ was formed. Two source electrodes 73 and 74, two drain electrodes 75 and 76, and two gate electrodes 77 and 78 as shown in FIG. 15b were formed by electron beam lithography and reactive ion beam etching. This device is capable of controlling two outputs simultaneously.

EXAMPLE 12

The same procedure as in Example 7 was repeated except that the substrate was replaced by a stress-free mirror-finished single crystal of magnesium oxide (MgO) with (100) index and the film on the substrate was re-placed by that of $Y_{0.4}Pr_{0.6}Ba_2Cu_3O_n$. The substrate was kept at 600° C. for epitaxial growth. The film thickness is 0.2 μm as in Example 7. On this film was formed a 0.08 μm thick film of $HoBa_2Cu_3O_m$ by reactive vapor deposition. Two each of source electrodes and drain electrodes were formed in the perpendicular direction in the same manner as in Example 11.

The dependence of source-drain current on the gate voltage was measured at the liquid helium temperature and liquid nitrogen temperature. It was possible to control the source-drain currents individually by the application of gate voltage. They were the same in magnitude. By contrast, in the case where the substrate is a single crystal of $SrTiO_3$ with (110) index, the supercurrent in the [001] direction is one-third that in the [110] direction. Therefore, a substrate of $SrTiO_3$ single crystal permits a single electrode to perform different controls.

As mentioned above, the superconducting device according to the present invention is provided with a superconducting electrode of oxide superconductor and a channel region of oxide normal conductor. Therefore, it produces the superconducting proximity effect over a long distance. In other words, it permits the source and drain to be positioned much more apart than before. This makes it very easy to form the source, drain, and gate electrodes.

Figure 1:
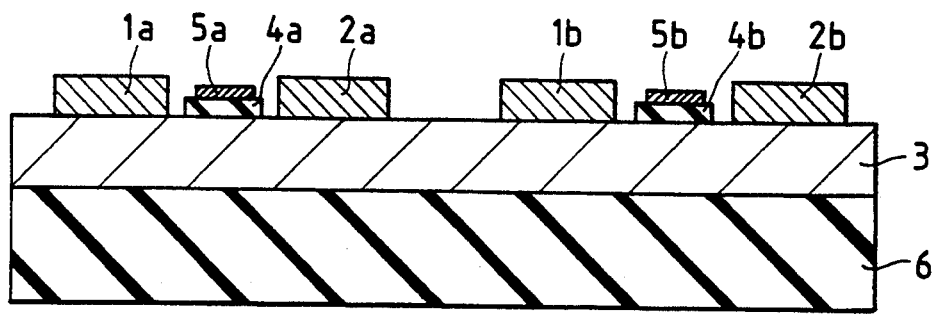
FIG. 1 is a sectional view showing the structure of the superconducting three-terminal device.
Figure 2:
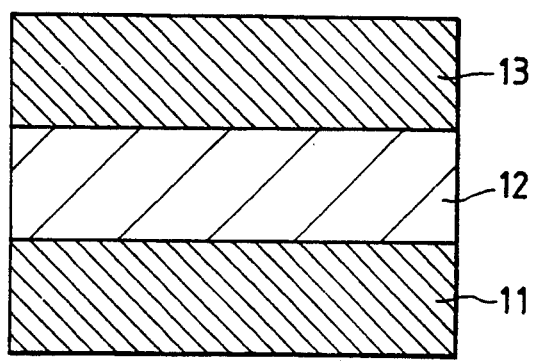
FIG. 2 is a schematic representation to explain the proximity effect of supercurrent flowing from the oxide superconducting layer to the oxide normal conducting layer.
Figure 19:
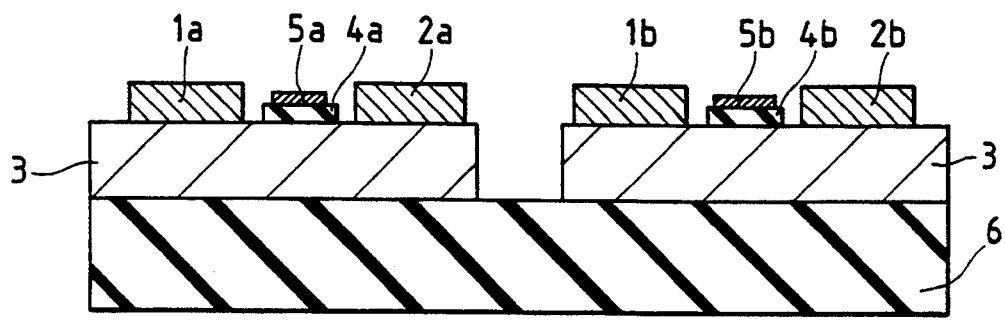
FIG. 19 is a schematic representation illustrating the prevention of interactions between superconducting devices or between superconducting wiring induced by the superconducting proximity effect.

The superconducting proximity effect over a long distance, however, poses some problems if many superconducting elements are densely integrated to such an extent as to shorten the distance between adjacent superconducting elements or superconducting wirings. In such a case the superconducting proximity effect brings about interactions between the superconducting elements and superconducting wirings, resulting in malfunctions and increased noise. For example, the device shown in FIG. 1 permits undesirable supercurrent (due to proximity effect) to flow between the drain electrode 2a and the source electrode 1b. This problem can be solved if the adjacent superconducting elements or superconducting wirings are electrically separated so that they do not affect each other. An example is shown in FIG. 19. In this case the adjacent drain electrode 2a and source electrode 1b are separated from each other by etching the semiconductor 3 between them. Etching may be replaced by ion implantation or chemical reaction which prevents supercurrent from flowing through the semiconductor. An alternative way is not to form the semiconductor between the superconducting devices or superconducting wirings from the first.

EXAMPLE 13

Figure 20:
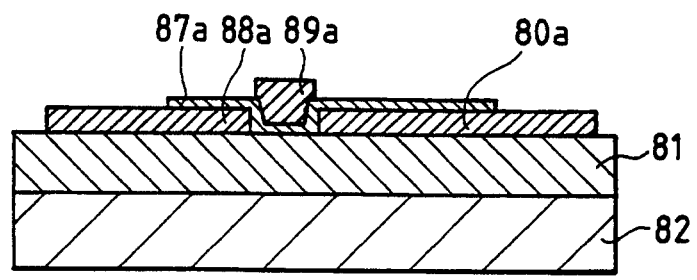
FIGS. 20 to 24b are schematic representations and graphs illustrating thirteenth embodiment of the present invention.
Figure 21:
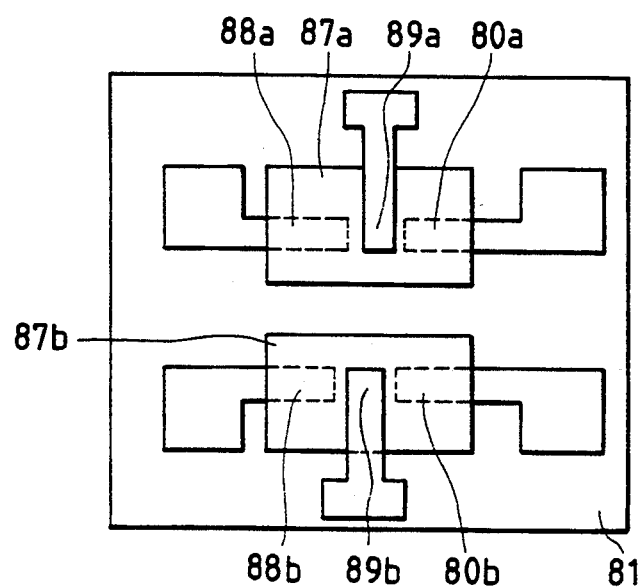

A planar-type superconducting field effect device was prepared which is shogun in FIG. 20 (sectional view) and FIG. 21 (plane view). The oxide superconductor is $HoBa_2Cu_3O_x$ (6.5 < X < 7.0). The oxide semiconductor is $La_{1.5}Ba_{1.5}Cu_3O_x$ (6.5 < X < 7.0). The substrate 82 is a single crystal of $SrTiO_3$ (110). First, on the substrate 82 was formed a semiconductor film 81 of $La_{1.5}Ba_{1.5}Cu_3O_x$ ($6.5 < X < 7.0$) by RF magnetron sputtering under the following conditions.

Target: sintered body of $La_{1.5}Ba_{1.5}Cu_{4.5}O_x$.
Substrate temperature: 650° C.
Sputtering gas: Ar—$O_2$ (50:50%) mixture at 30 mTorr.
RF power: 120 W.
Film forming rate: 0.15 μm/h.
Film thickness: 0.6 μm.
Film forming step was followed by cooling to room temperature in oxygen at 1 arm.

On the semiconductor film 81 was epitaxially formed an 80 nm thick superconducting film of $HoBa_2Cu_3O_x$ ($6.5 < X < 7.0$) at a rate of 60 nm/h by the reactive vapor deposition method, which employs microwave oxygen plasma, in the following manner. The substrate surface was cleaned for 30 minutes by heating at 580° C. with oxygen plasma generated by microwave (120 W) in oxygen (at $8 \times 10^{-5}$ Torr). Then, vapors of three metals (Ho, Ba, and Cu) were generated from three Knudsen cells so as to establish a composition of Ho:Ba:Cu=1:2:3. The film forming step was followed by cooling to room temperature in oxygen at 1 arm.

The thus formed superconducting film underwent reactive ion beam etching with $SF_6$ gas to form the patterns of source electrodes 88a and 88b and drain electrodes 80a and 80b. The gap at the channel between 88a and 80b is 100 nm. On this was formed a 150 nm thick $SrTiO_3$ insulating film 87a and 87b. On each insulating film was formed a 100 nm thick thin film of $HoBa_2Cu_3O_x$ ($6.5 < X < 7.0$), which was subsequently etched to form gate electrodes 89a and 89b.

Figure 22A:
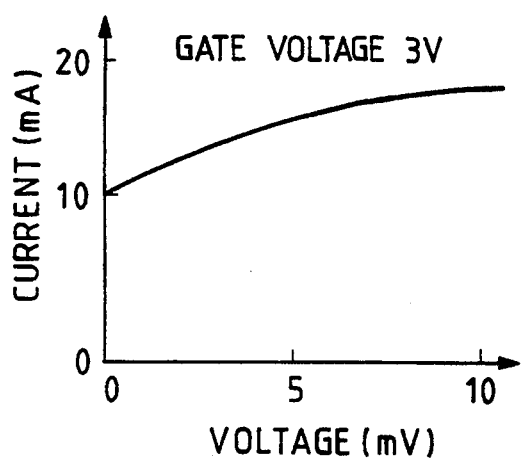
Figure 22B:
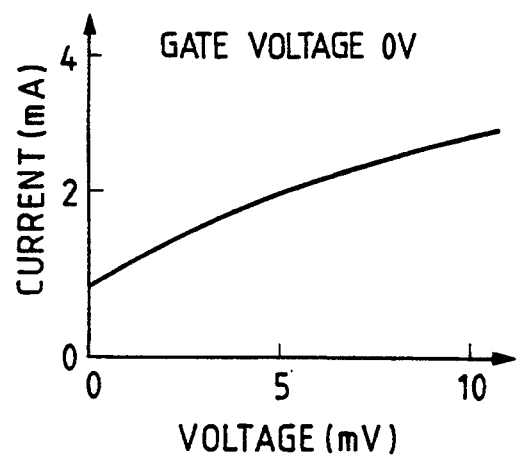
Figure 23:
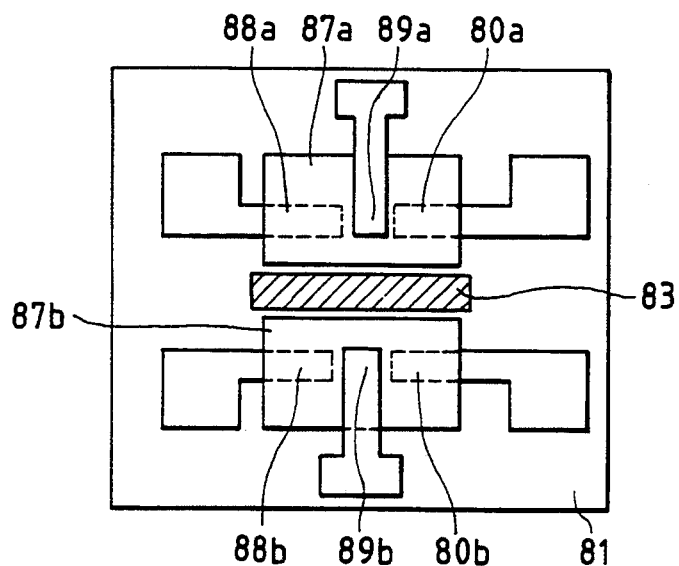

The thus formed device was tested for current-voltage characteristics. The results are shown in FIGS. 22a and 22b. It is noted that when a voltage of 3 V is applied to the gate electrodes 89a and 89b, supercurrent is 10 mA, and when no voltage is applied to the gate electrodes (or in the off state), supercurrent decreases to 1 mA. This device is not satisfactory because supercurrent in the off state remains high.

Figure 24A:
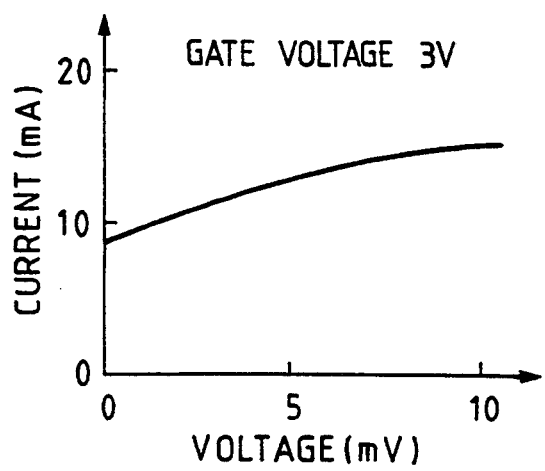
Figure 24B:
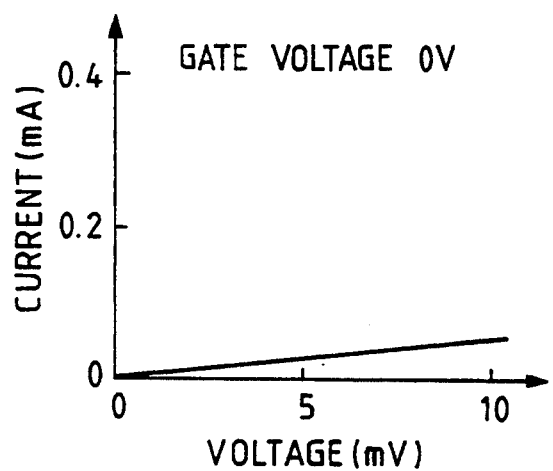

This device was tested again for current-voltage characteristics, with the adjacent devices separated by etching the middle part 83 of the semiconductor film 81. The results are shown in FIGS. 24a and 24b. It is noted that when the gate voltage is zero (or in the off state), supercurrent is less than 0.01 mA, which is small enough for the superconducting device to be practical.

This example demonstrates the possibility of utilizing an oxide superconductor to make superconductor circuits (such as logic circuits and memory circuits) with superconducting field effect transistors, superconducting wirings, superconducting loops, etc. arranged less than 1 μm apart.

EXAMPLE 14

Figure 25:
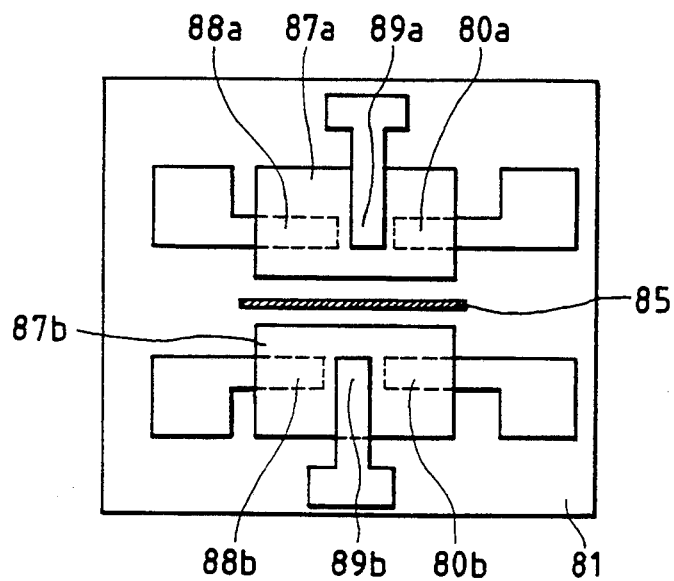
FIG. 25 is a schematic representation illustrating the fourteenth embodiment of the present invention.

A device as shown in FIG. 25 was prepared, which differs from the one shown in FIG. 21 in that the adjacent superconducting devices were separated by implantation of iron (Fe) ions ($10^{18}$/$cm^2$) into the semiconductor film 81 of $La_{1.5}Ba_{1.5}Cu_3O_x$ ($6.5 < X < 7.0$). The part of ion implantation is indicated by 85. This device exhibits the same current-voltage characteristics as that in Example 13. Thus this example also demonstrates the possibility of utilizing an oxide superconductor to make superconductor circuits (such as logic circuits and memory circuits) with superconducting field effect transistors, superconducting wirings, superconducting loops, etc. arranged less than 1 μm apart.

EXAMPLE 15

A device was prepared which is similar to but different from the one shown in FIG. 21 in that the adjacent superconducting devices are separated by depositing silicon on the semiconductor film 81 of $La_{1.5}Ba_{1.5}Cu_3O_x$ ($6.5 < X < 7.0$) and subsequently diffusing it into the semiconductor film by healing in oxygen at 500° C. for 5 hours. This device exhibits the same current-voltage characteristics as that in Example 13. Thus this example also demonstrates the possibility of utilizing an oxide superconductor to make superconductor circuits (such as logic circuits and memory circuits) with superconducting field effect transistors, superconducting wirings, superconducting loops, etc. arranged less than 1 μm apart.

As mentioned above, the present invention produces the following effects.
(1) The device does not require that the distance between superconducting electrodes be as narrow as 1 nm (which is extremely difficult to realize). Instead, it exhibits the superconducting characteristics even though the distance between superconducting electrodes is 0.1 μm to 1 μm.
(2) The device can be formed in planar structure by lithography. The planar structure facilitates the formation of integrated and three-terminal devices.
(3) The device (including switching circuit, microwave detector, and SQUID) capable of accurate control can be produced very easily according to desired specifications.

What is claimed is:
1. A superconducting device comprising
a single-crystalline insulative substrate;
a first film comprising a normal conducting oxide material and having a preferred crystal orientation being formed on a surface of said substrate;
a plurality of electrodes comprising a superconducting oxide material and having a crystal orientation identical to that of said first film and being directly formed on a surface of said first film and separated from each other by a predetermined distance;
a gate insulating film disposed on an exposed surface of said film; and
a gate electrode disposed on said gate insulating film to control a current flowing between said plurality of electrodes through said first film;
wherein said predetermined distance between the plurality of electrodes is 0.1 μm to 1.0 μm; and
wherein said superconducting oxide material and said normal conducting oxide material have the same crystal structure and contain copper as constituent-element.

2. A superconducting device comprising:
a single-crystalline substrate;
a first film comprising a non-superconducting non-insulating oxide material and having a preferred crystal orientation being formed on a surface of said substrate;
a plurality of electrodes comprising a superconducting oxide material and having a crystal orientation identical as that of said first film and being directly formed on a surface of said first film and separated from each other by a predetermined distance;
a gate insulating film disposed on an exposed surface of said first film; and a gate electrode disposed on said gate insulating film to control a current flowing between said plurality of electrodes through said first film;

wherein said predetermined distance between the plurality of electrodes is 0.1 μm to 1.0 μm; and wherein said superconducting oxide material and said non-superconducting non-insulating oxide material have the same crystal structure and contain copper as a constituent-element.

3. The superconducting device according to claim 1, wherein the normal conducting oxide material is a derivative of the superconducting oxide material.

4. The superconducting device according to claim 3, wherein said derivative is one which is formed from the oxide superconductor such that it has exchanged cations.

5. The superconducting device according to claim 3, wherein said derivative is one which is formed from the oxide superconductor such that it contains cations in nonstoichiometric ratio.

6. The superconducting device according to claim 3, wherein said derivative is one which is formed from the oxide superconductor such that it is deficient in oxygen.

7. The superconducting device according to claim 3, wherein said derivative is one which is formed from the oxide superconductor such that it contains excess oxygen.

8. The superconducting device according to claim 1, wherein the normal conducting oxide material and the superconducting oxide material have the perovskite-type crystal structure.

9. The superconducting device according to claim 1, wherein the normal conducting oxide material has anti-ferromagnetic properties.

10. The superconducting device according to claim 2, wherein the non-superconducting non-insulating oxide material has semiconductive properties.

11. The superconducting device according to claim 1, wherein said normal conducting oxide material is single-crystalline and an insulating film is formed on said first film of the single-crystalline normal conducting oxide material and a gate electrode is formed on this insulating film at a region of separation between two of said electrodes.

12. The superconducting device according to claim 11, wherein a plurality of gate electrodes are formed on the insulating film in said region of separation between the two electrodes.

13. The superconducting device according to claim 1, further comprising an insulator disposed between adjacent ones of said plurality of electrodes that are part of different devices to prevent the interaction between adjacent superconducting regions which is otherwise induced by the proximity effect of the superconducting oxide material.

14. The superconducting device according to claim 13, wherein said insulator further comprises an ion-implanted region formed in said first film.

15. The superconducting device according to claim 13, wherein said insulator further comprises a groove forming a separation between regions of said first film.

16. The superconducting device according to claim 13, wherein said insulator comprises a region formed by the introduction of ferromagnetic elements into said first film.

17. The superconducting device according to claim 13, wherein the normal conducting oxide material is one selected from the group consisting of oxygen-deficient Y—Ba—Cu oxide, Pr—Ba—Cu oxide, or La—Ba—Cu oxide, and Y—Ba—Cu oxide having a ferromagnetic element or metal incorporated therein.

18. The superconducting device according to claim 1, wherein said normal conducting oxide material and said superconducting oxide material both comprise an oxide of Ln, Ba, and Cu, where LN is selected from a group consisting of La, Pr, Y and Nd and has a perovskite-type crystal structure.

19. The superconducting device according to claim 1, wherein said normal conducting oxide material and said superconducting oxide material both comprise an oxide of Ln, Sr and Cu, where Ln is selected from a group consisting of La, Pr, Y and Nd and has a perovskite crystal structure.

20. The superconducting device according to claim 18, wherein said normal conducting oxide material and said superconducting oxide material both have a composition of $LnBa_2Cu_3O_{7-x}$, wherein Ln is selected from a group consisting of La, Pr, and Nd, and where x is 0.4 to 0.8.

21. The superconducting device according to claim 18, wherein said Cu is substituted by 3% to 50% of impurities selected from the group consisting of Fe, Ca, Al and Ga.

22. The superconducting device according to claim 1, wherein an area of said exposed surface of said first film contacting said gate insulating film has a height below that of remaining surface portions of said first film on which said plurality of electrodes are disposed.

23. The superconducting device according to claim 2, wherein an area of said exposed surface of said first film contacting said gate insulating film has height below that of a remaining surface of said first film on which said plurality of electrodes are disposed.

24. The superconducting device according to claim 1, wherein said plurality of electrodes include a source electrode and a drain electrode and further comprising a plurality of said gate electrodes disposed between source and drain electrodes.

* * * * *

UNITED STATES PATENT AND TRADEMARK OFFICE
CERTIFICATE OF CORRECTION

PATENT NO. : 5,380,704               Page 1 of 3
DATED : January 10, 1995
INVENTOR(S) : Yoshinobu Tarutani, et al It is certified that error appears in the above-indentified patent and that said Letters Patent is hereby corrected as shown below:

| Column | Line  | |
|--------|-------|---|
| 1 | 13 | Change "to generally" to --generally to--. |
| 1 | 14 | After "ducting" insert --field effect transistors--. |
| 1 | 28 | Before "temperature" insert --critical--. |
| 1 | 53 | Change "Josphson" to --Josephson--; change "superconductor" to --superconducting--. |
| 1 | 54 | Change "device)" to --devices)--. |
| 2 | 10-11 | Change "technique." to --techniques.--. |
| 2 | 35 | After "from" change "an" to --a--.- |
| 3 | 24 | Change "h'/n" to --h'/m--. |
| 3 | 45 | Change "include" to --includes--. |

UNITED STATES PATENT AND TRADEMARK OFFICE
CERTIFICATE OF CORRECTION

PATENT NO. : 5,380,704
DATED : January 10, 1995
INVENTOR(S) : Yoshinobu Tarutani, et al It is certified that error appears in the above-indentified patent and that said Letters Patent is hereby corrected as shown below:

| Column | Line | |
|---|---|---|
| 4 | 46 | Change "Treater" to --greater--. |
| 5 | 57 | Change "sixth" to --the sixth--. |
| 5 | 59 | Change "the sixth" to --in the sixth--. |
| 6 | 7 | After "18b" insert --are--. |
| 6 | 15 | After "illustrating" insert --the--. |
| 6 | 31 | Change "wish" to --with--. |
| 9 | 10 | Change "$Sr_{CuO4}$" to --$Sr_xCuO_4$--. |
| 9 | 37 | Change "argon" to --ECR--. |
| 9 | 38 | Delete "at". |

UNITED STATES PATENT AND TRADEMARK OFFICE
CERTIFICATE OF CORRECTION

PATENT NO. : 5,380,704
DATED : January 10, 1995
INVENTOR(S) : Yoshinobu Tarutani, et al It is certified that error appears in the above-indentified patent and that said Letters Patent is hereby corrected as shown below:

| Column | Line | |
|---|---|---|
| 9 | 45 | After "Apparently" insert --,--; change "remained" to --continued--. |
| 11 | 6 | Change "wish" to --with--; change "plade" to --placed--. |
| 12 | 10 | Change "re-placed" to --replaced--. |
| 12 | 63 | Change "shogun" to --shown--. |
| 12 | 66 | Change "$Cu_{30x}$" to --$Cu_3O_x$--. |
| 13 | 23 | Change "arm." to --atm.-- |
| 14 | 8 | Change "healing" to --heating--. |
| 14 | 64 | Change "as" to --to--. |
| 16 | 22 | Change "LN" to --Ln--. |

Signed and Sealed this

Sixth Day of June, 1995

Attest:

BRUCE LEHMAN

*Attesting Officer*  *Commissioner of Patents and Trademarks*